(12) United States Patent
Lilienthal

(10) Patent No.: US 11,781,363 B2
(45) Date of Patent: Oct. 10, 2023

(54) OPTOELECTRONIC SAFETY DEVICE AND METHOD FOR MONITORING A MOVEMENT OF A MACHINE

(71) Applicant: CEDES AG, Landquart (CH)

(72) Inventor: Christian Lilienthal, Cologne (DE)

(73) Assignee: CEDES AG, Landquart (CH)

( * ) Notice: Subject to any disclaimer, the term of this patent is extended or adjusted under 35 U.S.C. 154(b) by 628 days.

(21) Appl. No.: 16/970,633

(22) PCT Filed: Feb. 18, 2019

(86) PCT No.: PCT/EP2019/053957
§ 371 (c)(1),
(2) Date: Aug. 18, 2020

(87) PCT Pub. No.: WO2019/162229
PCT Pub. Date: Aug. 29, 2019

(65) Prior Publication Data
US 2021/0095511 A1 Apr. 1, 2021

(30) Foreign Application Priority Data
Feb. 20, 2018 (DE) ...................... 10 2018 103 729.5

(51) Int. Cl.
*E05F 15/40* (2015.01)
*E05F 15/70* (2015.01)
*H03M 1/12* (2006.01)

(52) U.S. Cl.
CPC .............. *E05F 15/40* (2015.01); *E05F 15/70* (2015.01); *H03M 1/12* (2013.01); *E05Y 2900/40* (2013.01)

(58) Field of Classification Search
CPC ...... H02P 3/00; H02P 3/06; H02P 3/18; H02P 6/00; H02P 6/005; H02P 6/24; H02P 6/26;
(Continued)

(56) References Cited

U.S. PATENT DOCUMENTS 9,761,113 B1 * 9/2017 Gelineau ............. G08B 21/182
2016/0047159 A1 2/2016 Scholten
(Continued)

FOREIGN PATENT DOCUMENTS

| CN | 105423112 A | 3/2016 |
| CN | 107037500 A | 8/2017 |

(Continued)

*Primary Examiner* — Antony M Paul
(74) *Attorney, Agent, or Firm* — Norman B. Thot

(57) ABSTRACT

An optoelectronic safety device for monitoring a machine movement includes a detection device and a control device. The detection device includes a transmitter unit which transmits an optical signal having a sequence of signal pulses, each of which has a different pulse intensity, and a receiver unit which receives the optical signal. The control device includes an evaluation unit which evaluates the optical signal received by the receiver unit, a pulse selection index, and a pulse selection unit which changes the pulse selection index if the pulse intensity of one of the signal pulses is outside of an optimal intensity range. The control device enables the machine movement if an intensity of a received signal is within a permissible intensity range, and outputs a trigger pulse to stop the machine movement if the intensity of the received signal is outside of the permissible intensity range.

16 Claims, 3 Drawing Sheets

(58) Field of Classification Search
CPC ...... H02P 6/30; H02P 7/00; H02P 8/30; H02P 27/00; H02P 27/04; H02P 27/06; H02P 27/08; G08B 21/22; G08B 21/182; G01V 8/22; G01V 8/10; G01V 8/26; F16P 3/14; F16P 3/144; E05F 15/40; E05F 15/43; G02B 6/4206
See application file for complete search history.

(56) References Cited

U.S. PATENT DOCUMENTS

| | | |
|---|---|---|
| 2017/0090065 A1 | 3/2017 | Ferchau |
| 2017/0366275 A1 | 12/2017 | Charlantini et al. |

FOREIGN PATENT DOCUMENTS

| | | |
|---|---|---|
| CN | 107576994 A | 1/2018 |
| DE | 3728354 A1 | 3/1989 |
| DE | 196 04 900 A1 | 8/1997 |
| DE | 299 01 664 U1 | 4/1999 |
| DE | 103 18 764 A1 | 11/2003 |
| DE | 20 2008 009 320 U1 | 10/2008 |
| DE | 10 2007 036 632 A1 | 2/2009 |
| DE | 10 2009 045 322 A1 | 4/2011 |
| DE | 10 2011 102 233 A1 | 11/2012 |
| DE | 20 2008 018 463 U1 | 3/2014 |
| EP | 1 048 927 A2 | 11/2000 |
| EP | 2 527 878 A2 | 11/2012 |
| EP | 2 778 333 A1 | 9/2014 |
| EP | 2 990 836 A1 | 3/2016 |
| EP | 3 151 036 A1 | 4/2017 |
| GB | 2547486 A | 8/2017 |
| JP | 2000-18492 A | 1/2000 |
| JP | 2002-100975 A | 4/2002 |

* cited by examiner

OPTOELECTRONIC SAFETY DEVICE AND METHOD FOR MONITORING A MOVEMENT OF A MACHINE

CROSS REFERENCE TO PRIOR APPLICATIONS

This application is a U.S. National Phase application under 35 U.S.C. § 371 of International Application No. PCT/EP2019/053957, filed on Feb. 18, 2019 and which claims benefit to German Patent Application No. 10 2018 103 729.5, filed on Feb. 20, 2018. The International Application was published in German on Aug. 29, 2019 as WO 2019/162229 A1 under PCT Article 21(2).

FIELD

The present invention relates to an optoelectronic safety device for monitoring a movement of a machine, in particular for monitoring the movement of a gate or a door, the optoelectronic safety device comprising a sensing device having at least one transmitter unit for transmitting an optical signal and at least one receiver unit for receiving the optical signal, and a control device having an evaluation unit for evaluating the signal received at the receiver unit, wherein the control device enables the movement of the machine if the intensity of the received signal is within a permissible intensity range, and the control device outputs a triggering pulse to stop the movement of the machine if the intensity of the received signal is outside of a permissible intensity range. The present invention further relates to a method for monitoring a machine movement.

BACKGROUND

Such safety devices are often used where an area of movement of a structural element of a machine or a device must be monitored to avoid collisions. Typical applications are passages or driveways with automatically closing or motor-driven industrial gates.

Various such safety devices have previously been described. DE 20 2008 009 320 U1 describes an optoelectronic safety device which includes a detection device for avoiding danger which is caused, for example, by movable machine parts in the gate area. DE 37 28 354 describes optoelectronic safety devices at gate systems which consist of a detection device with a transmitter unit and a receiver unit, a control unit, as well as light sources.

Optoelectronic safety devices mostly comprise a transmitter unit and a receiver unit, between which an optical signal, for example, a light beam, is transmitted. A danger zone in which a machine movement occurs can thereby be monitored continuously. The control device outputs a trigger pulse to stop the machine movement if the optical signal is interrupted by an obstacle in the danger zone.

A known problem with such optoelectronic detection devices is that the intensity of the optical signal received at the receiver unit depends on the distance between the receiver unit and the transmitter unit in addition to being influenced by the ambient temperature. A change in the received signal intensity may also be caused by wear. For an orderly operation of the safety device and in order to avoid frequent erroneous triggerings of the safety device, the detection device, in particular the transmitter unit, must be specifically designed for and/or adapted to the existing conditions of the machine to be monitored. In the case of large temperature differences or significant wear of the machine, undesirable erroneous triggerings of the detection devices may still occur due to the resultant changes in the received signal intensities.

SUMMARY

An aspect of the present invention is to provide an optoelectronic safety device for monitoring a machine movement with which the above-mentioned disadvantages can be overcome and which in particular allows for a reliable monitoring of the danger zones, while still being simple to install.

In an embodiment, the present invention provides an optoelectronic safety device for monitoring a machine movement. The optoelectronic safety device comprises a detection device and a control device. The detection device comprises at least one transmitter unit which is configured to transmit an optical signal which comprises a sequence of signal pulses, each of the signal pulses having a pulse intensity which is different, and at least one receiver unit which is configured to receive the optical signal. The control device comprises an evaluation unit which is configured to evaluate the optical signal received by the at least one receiver unit, a pulse selection index, and a pulse selection unit which is configured to change the pulse selection index if the pulse intensity of one of the signal pulses is outside of an optimal intensity range. The control device is configured to enable the machine movement if an intensity of a received signal is within a permissible intensity range, and to output a trigger pulse to stop the machine movement if the intensity of the received signal is outside of the permissible intensity range.

BRIEF DESCRIPTION OF THE DRAWINGS

The present invention is described in greater detail below on the basis of embodiments and of the drawings in which.

DETAILED DESCRIPTION

Figure 1:
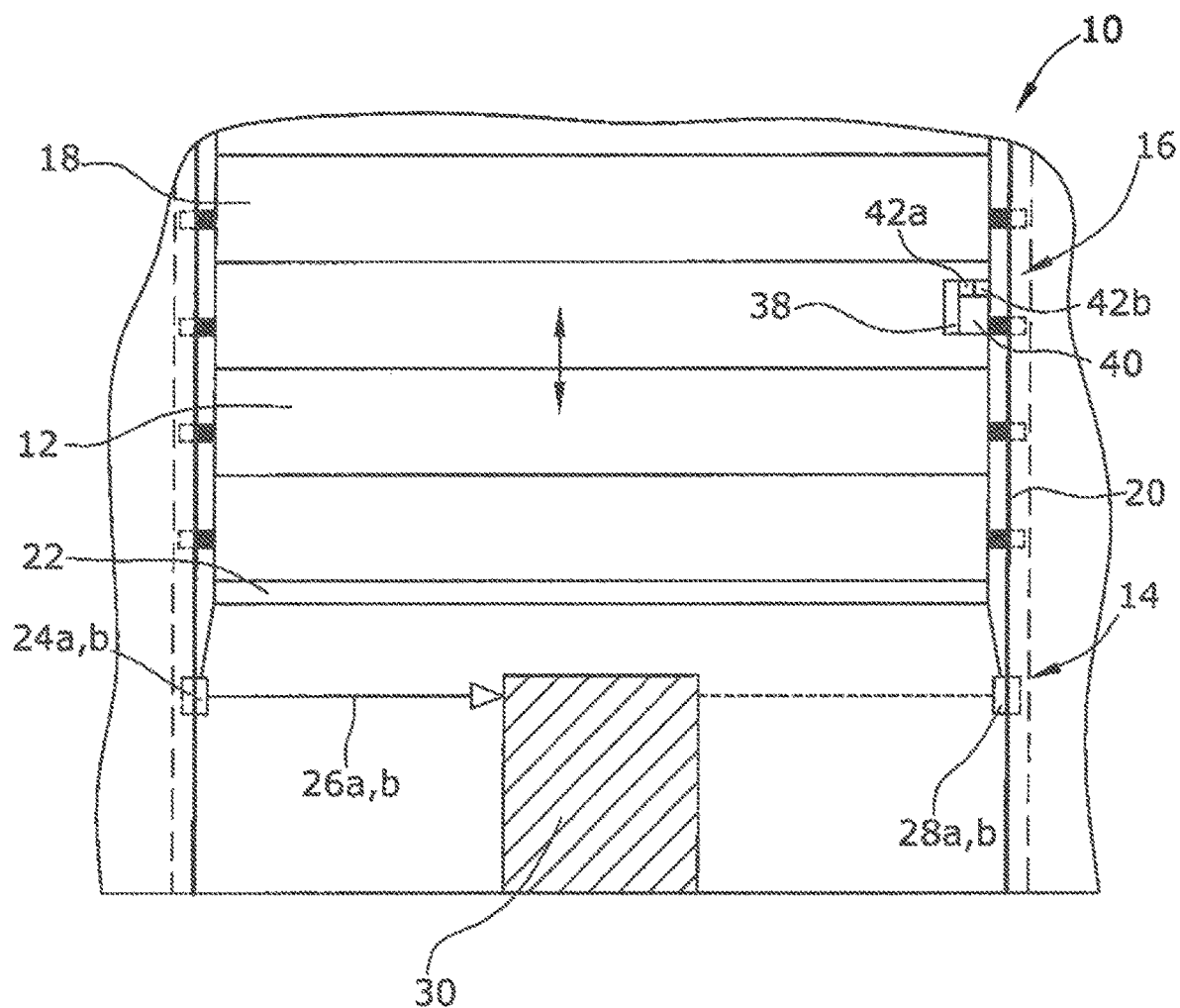
FIG. 1 shows a schematic front view of a rolling gate with an optoelectronic safety device of the present invention.

According to the present invention, the optical signal comprises a sequence of a plurality of signal pulses, wherein the signal pulses have pulse intensities that differ from one another, the control device comprising a pulse selection index, and the control device further comprising a pulse selection unit which is adapted to change the pulse selection index if a pulse intensity of the evaluation signal pulse is outside of an optimal intensity range.

The pulse intensities of the signal sequence are designed to cover a wide range of intensities. This allows the safety device of the present invention to perform an orderly monitoring of the machine movement even if the received signal intensity changes, caused, for example, by large temperature differences. The pulse selection unit here adapts the pulse selection index so that the evaluation unit is provided with a signal having an evaluable intensity. The safety device of the present invention is also suited to automatically adapt itself to different distances between the transmitter unit and the receiver unit by selecting a signal pulse having a suitable pulse intensity; no special design of the transmitter unit or complex adaptation of the detection device to the machine to be monitored is therefore required.

In an embodiment of the present invention, the signal pulses in the sequence can, for example, have a pulse intensity which continuously increases or continuously decreases from the first signal pulse to the last signal pulse. This enables the pulse selection unit to make a simple selection of a signal pulse with a suitable pulse intensity. If the signal pulse predetermined via the pulse selection index has a pulse intensity that is too low, the pulse selection unit increases/decreases the pulse selection index in order to select the signal pulse with the next higher pulse intensity. If the signal pulse predetermined by the signal pulse selection index has a pulse intensity that is too high, the pulse selection unit decreases/increases the pulse selection index in order to select the signal pulse with the next lower pulse intensity.

In an embodiment of the present invention, the control device, the evaluation unit, or the pulse selection unit can, for example, be integrated into the detection device. The evaluation unit or the pulse selection may in particular be integrated into the receiver unit. This allows for a particularly compact structure of the safety device.

In an embodiment of the present invention, the detection device can, for example, comprise at least two transmitter units and at least two receiver units. The plurality of transmitter units or receiver units can, for example, be arranged along a depth dimension of the machine and transmit/receive parallel extending optical signals. This allows for a reliable monitoring of machines having a relatively large depth dimension which could otherwise only be monitored with difficulty or not at all when a single transmitter unit/receiver unit is used.

In an embodiment of the present invention, the transmitter units can, for example, be designed so that they each transmit an optical signal with a sequence of signal pulses, whereby the signal pulse sequences of the individual signals do not overlap each other in time. Interferences between the individual signals of the plurality of transmitter units are thereby minimized and the reliability of the safety device is thus maximized.

In an embodiment of the present invention, the control device can, for example, comprise at least two pulse selection indices, wherein the number of the pulse selection indices can, for example, correspond to the number of transmitter units/receiver units and thus correspond to the number of transmitted optical signals. This allows for a separate selection of a signal pulse with a suitable pulse intensity for each transmitted optical signal, and thus for a particularly reliable monitoring of the entire depth of the machine.

In an embodiment of the present invention, the control device or the evaluation unit can, for example, comprise a time module which is adapted to detect the duration of the impermissible signal intensity and, if a minimum duration is exceeded, to output the trigger pulse for stopping the machine movement. It is thereby possible to prevent an erroneous triggering in the case of a signal reduction or a signal absence not caused by an obstacle.

In an embodiment of the present invention, the receiver unit or the evaluation unit can, for example, be adapted to convert an incoming analog signal into an outgoing digital signal. It can thereby be determined in a simple manner, using the output-side digital signal, whether a trigger pulse, i.e., a signal intensity outside of a permissible intensity range, exists or not. For example, when an impermissible intensity exists in the digital signal, a logical "one" can be output, and when a permissible intensity exists, a logical "zero" can be output. The receiver unit or the evaluation unit may, for example, comprise a Schmitt trigger for this purpose. This allows for a simple and low-cost safety device.

The evaluation unit or the pulse selection unit is advantageously integrated into a microprocessor. The microprocessor can comprise the entire control device of the safety device and can further also comprise a motor electronics of the machine drive. This allows for a central control of the machine movement. The control device can also be integrated into the overall control system in a low-cost manner.

In an embodiment of the present invention, the receiver unit can, for example, comprise an electromagnetic shielding for protection from electromagnetic interference radiation. The interference can disturb signal detection in the receiver unit and thereby cause erroneous triggering.

In an embodiment of the present invention, the detection device can, for example, be mounted on a gate, for example, on a closing edge of the gate. The detection device may thus be designed as a light barrier leading the gate. A transmitter unit may here be arranged on a first side of the gate and the receiver unit may be arranged on a second side of the gate which is opposite to the first side. The transmitter unit and the receiver unit may alternatively be arranged on the same side of the gate, wherein a reflector is arranged on the opposite side. A gate should thereby be understood to be any type of gate, in particular a sectional gate, a screen gate, a sliding gate, or a rolling gate.

The present invention provides the following steps in a method for monitoring a machine movement:
transmitting an optical signal from a transmitter unit, wherein the optical signal comprises a sequence of signal pulses with different pulse intensities,
receiving the optical signal at a receiver unit,
determining the individual signal pulse intensities of the received signal,
evaluating, in the evaluation unit, the pulse intensity of a signal pulse of the received signal which is predetermined by the pulse selection index, wherein,
a trigger pulse for stopping the machine movement is output to a control device if a pulse intensity is detected which is outside of a permissible intensity range, and
an evaluation of the pulse intensity is performed in a pulse selection unit if a pulse intensity is detected which is within an permissible intensity range, wherein the pulse selection index is changed if a pulse intensity is detected which is outside of an optimal intensity range.

A particularly reliable and efficient monitoring of the machine monitoring can thereby be performed even in the case of a variable signal intensity.

In an embodiment of the present invention, the duration of the impermissible pulse intensity can, for example, be detected during the evaluation of the pulse intensity of the signal pulse which is predetermined by the pulse selection index in the evaluation unit, and the trigger pulse for stopping the machine movement is output to the control device if a predefined minimum duration is exceeded. The minimum duration may be calculated or predetermined.

A minimum intensity value or a maximum intensity value which delimits the permissible intensity range is advantageously calculated as a proportion of an average value. This, for example, allows for a dynamic adaptation of the permissible intensity range to a changed signal intensity. The permissible intensity range can also be adapted to different movement speeds of the machine in a simple manner by varying the proportion.

In an embodiment of the present invention, a plurality of optical signals can, for example, be transmitted and received, wherein the pulse intensity of a signal pulse predetermined by a pulse selection index is evaluated separately in the evaluation unit for each optical signal. A separate pulse selection index is thus provided for each received optical signal. This allows for a separate selection of a signal pulse with a suitable pulse intensity for each received signal.

The pulse selection index is advantageously decreased if a pulse intensity above the optimal intensity range is detected, and the pulse intensity is advantageously increased if a pulse intensity below the optimal intensity range is detected. This allows for a simple adaptation of the pulse selection index.

An embodiment of an optoelectronic safety device for monitoring a machine movement of the present invention will be described below under reference to the drawings.

FIG. 1 shows a typical application of a safety device 10 of the present invention, wherein the safety device 10 monitors the movement of an automatically operated rolling gate 12 which can be moved up and down driven by a drive motor. The rolling gate 12 is formed by a plurality of gate segments 18 laterally supported in a guide rail 20 so as to be movable therein. A closing edge 22 is provided at a bottom side of the rolling gate 12, which closing edge 22 rests on a floor in the closed state.

Figure 2:
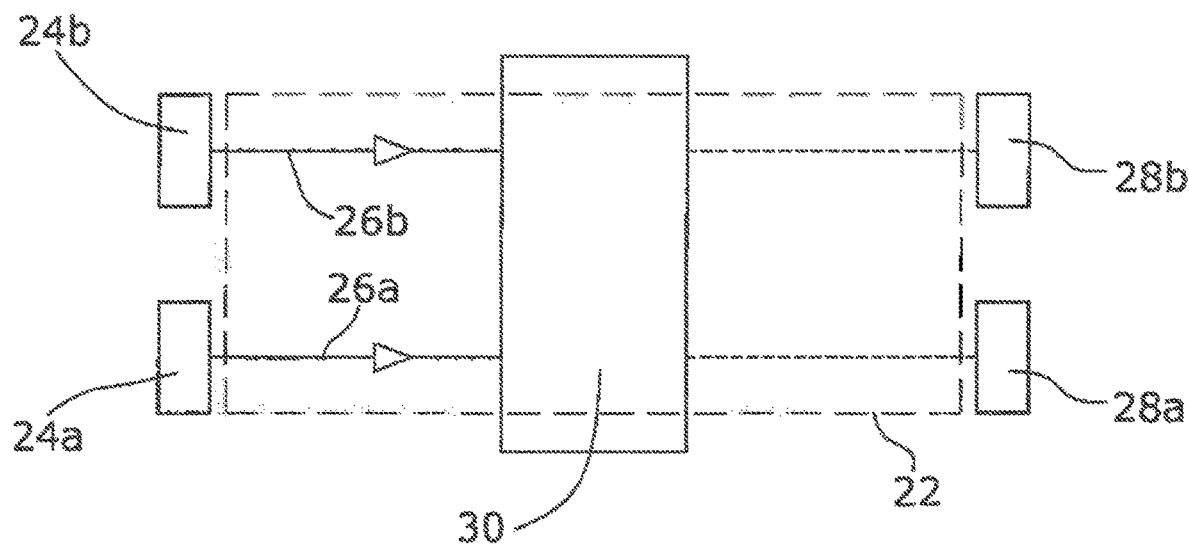
FIG. 2 shows a schematic top plan view of a detection device of the safety device.

The detection device 14 is arranged below the closing edge 22 of the rolling gate 12 and comprises two transmitter units 24a,b for transmitting optical signals 26a,b and two receiver units 28a,b for receiving the optical signals 26a,b. For forming a defined distance between the detection device 14 and the closing edge 22, the transmitter units 24a,b and the receiver units 28a,b are fastened on a ledge or a metal sheet protruding downward from the closing edge 22. The detection device 14 thus forms a detection system leading the rolling gate 12 when the rolling gate 12 is closed or moved downward, wherein the distance between the detection device 14 and the closing edge 22 is designed according to a required delay time for a collision-free stopping of the rolling gate 12 after detection of an obstacle 30. The transmitter units 24a,b and the receiver units 28a,b are each fastened at an outermost lateral end of the rolling gate 12 and are at least partly surrounded by the guide rail 20 of the rolling gate 12 so that the entire width of the rolling gate 12 can be monitored by the detection device 14. The transmitter units 24a,b and the receiver units 28a,b are, as is illustrated in FIG. 2, arranged in the depth direction of the closing edge 22, wherein the transmitter unit 24a and the receiver unit 28a are arranged opposite each other on the front side of the closing edge 22, and the transmitter unit 24b and the receiver unit 28b are arranged opposite each other on the rear side of the closing edge 22. In order to avoid the detection device 14 from hitting the floor when the rolling gate 12 is completely closed, a recess (which is not illustrated in FIG. 1) is provided in the floor for the detection unit 14 to be lowered thereinto or received therein.

In the present instance, the detection device 14 is formed by two light barriers, wherein a first optical signal 26a is output from the transmitter unit 24a and is received by the receiver 28a, and a second optical signal 26b is output from the transmitter unit 24b and is received by the receiver unit 28b. In an ideal case (as illustrated in FIG. 1), the transmitter units 24a,b and the receiver units 28a,b are arranged with respect to each other so that the optical signals 26a,b each run along the shortest connecting distance between the respective transmitter unit 24a,b and the respective receiver unit 28a,b. If an obstacle 30 is present in the movement zone of the rolling gate 12 as is illustrated in FIG. 1, the optical signal 26a and/or the optical signal 26b of the detection device 14 is interrupted, whereby the signal intensity of the optical signal received by the corresponding receiver unit 28a,b is at least significantly reduced or, in an ideal case, is eliminated altogether.

The signal intensity received by the receiver units 28a,b in case of an unobstructed transmission of the optical signals 26a,b depends inter alia on the distance between the transmitter units 24a,b and the corresponding receiver units 28a,b and thus on the width of the rolling gate 12. The optical signal 26a,b transmitted by the transmitter unit 24a,b must therefore have a signal intensity which is adapted to the width of the rolling gate 12. Variations in the signal intensity received by the receiver unit 28a,b can also occur due to environmental influences, for example, due to temperature changes or weather-related vibrations of the rolling gate 12.

Figure 3:
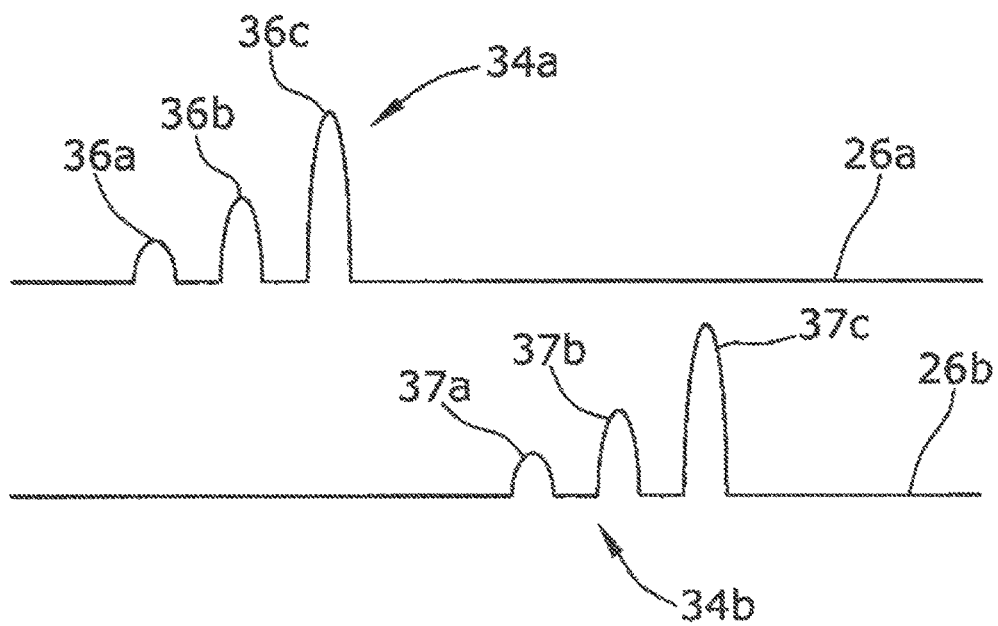
FIG. 3 shows schematic signal paths of optical signals of the detection device.

For compensating these changes in the received signal intensity in the case of unobstructed signal transmission, the optical signals 26a,b each comprise a signal sequence 34a,b of three signal pulses 36a-c and 27a-c, respectively, wherein the signal pulses in the signal sequence 34a,b have a pulse intensity continuously increasing from the first signal pulse 36a,37a to the last signal pulse 36c, 37c, respectively. The signal paths 32a,b of the optical signals 26a,b are illustrated in FIG. 3, wherein the signal path 32a corresponds to the time course of the transmitted signal intensity of the optical signal 26a and the signal path 32b corresponds to the time course of the transmitted signal intensity of the optical signal 26b. The signal sequences 34a,b of the two optical signals 26a,b are transmitted in a time-staggered manner to avoid interferences.

Figure 4:
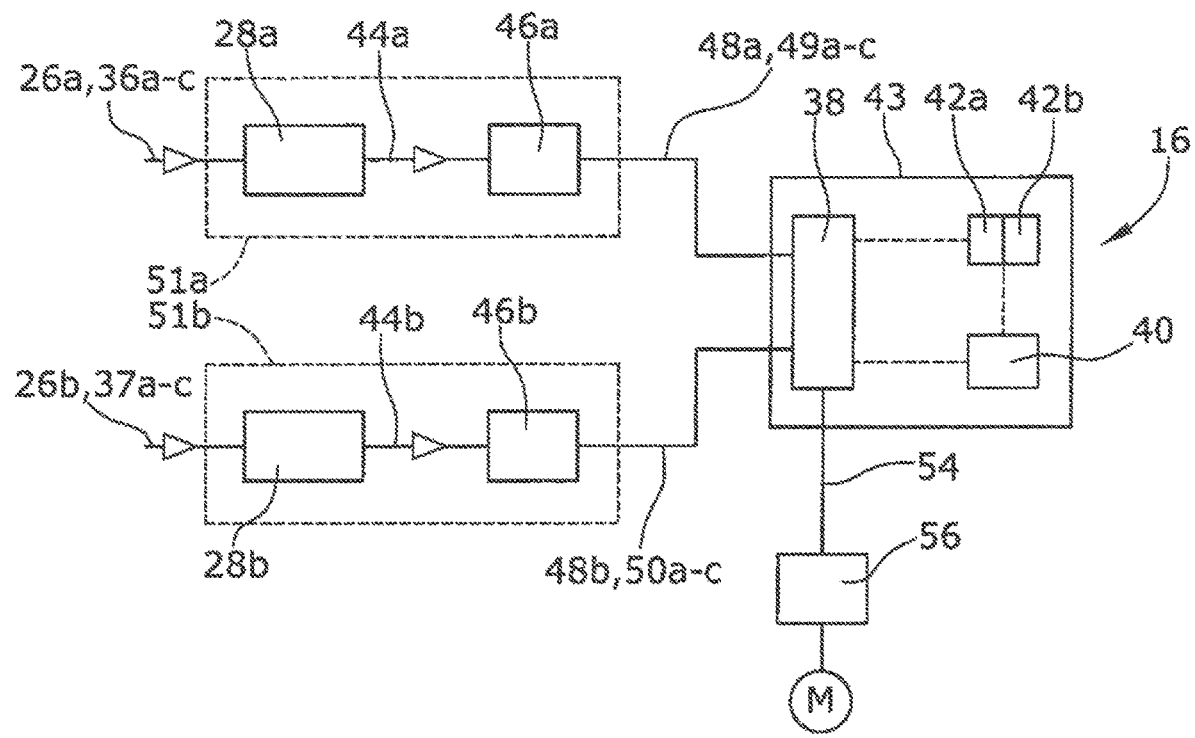
FIG. 4 shows a schematic wiring of a control device of the safety device.

In the present embodiment, the control device 16 is mounted on the rolling gate 12, but may, in an alternative embodiment, also be arranged to be stationary. The control device 16 can also be integrated into the detection device 14. The control device comprises an evaluation unit 38, a pulse selection unit 40, and two pulse selection indices 42a,b. The wiring of the control device 16 is schematically illustrated in FIG. 4. The evaluation unit 38 serves to evaluate the intensities of the optical signals 26a,b received by the receiver units 28a,b, wherein the evaluation unit 38 evaluates one signal pulse 36a-c, 37a-c of each received optical signal 26a,b, which signal pulse 36a-c, 37a-c has been predetermined by the pulse selection indices 42a,b. The pulse selection unit 40 serves to adapt the pulse selection indices 42a,b according to the received pulse intensities of the signal pulses 36a-c, 37a-c. The evaluation unit 38, the pulse selection unit 40, and the pulse selection indices 42a,b are integrated into a microcontroller 43.

The optical signal 26a,b transmitted by the transmitter units 24a,b is continuously received by the receiver units 26a,b, respectively, and an electric analog signal 44a,b is provided at an output, which electric analog signal 44a,b represents the time course of the signal intensity of the received optical signal 26a,b. The electric analog signals 44a,b are each converted into a digital signal 48a,b in an analog-to-digital converter 46a,b. The digital signals 48a,b include an intensity value 49a-c and 50a-c, respectively, for each signal pulse 36a-c, 37a-c of the optical signals 26a,b and are supplied to the evaluation unit 38. Electromagnetic shieldings 51a,b are provided to protect the receiving unit 28a,b and the analog-to-digital converter 46a,b from electromagnetic interference radiation.

Figure 5:
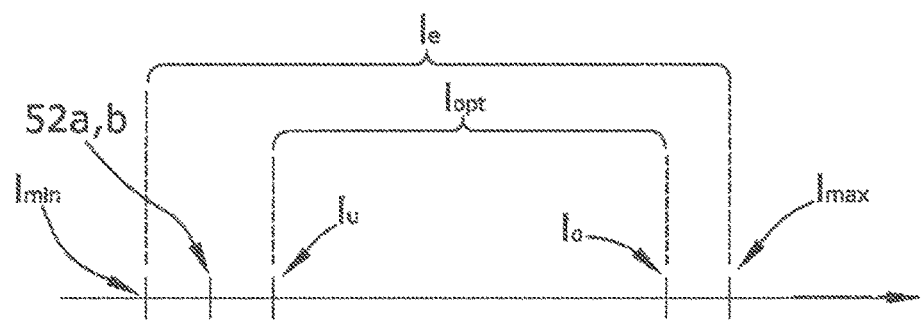
FIG. 5 shows a permissible and an optimal intensity range for a received optical signal.

The evaluation unit 38 determines a respective evaluation intensity value 52a,b for the two digital signals 48a, b, wherein it is predetermined by the pulse selection indices 42a,b which of the received intensity values 49a-c, 50a-c are evaluated. If one of the evaluation intensity values 52a,b is outside of a permissible intensity range Ie which (as illustrated in FIG. 5) is defined by a minimum intensity Imin and a maximum intensity Imax, the evaluation unit 38 provides a trigger signal 54 to a motor electronics 56 at an output to immediately stop the drive motor M. The minimum intensity Imin and the maximum intensity Imax can be calculated, for example, as a proportion of an average value of signal intensities. It is also possible to provide a time module (which is not illustrated in the drawings) in the evaluation unit 38, which time module is suitable for determining the duration during which the evaluation intensity value 52a,b is outside of the permissible intensity range Ie. The trigger signal 54 is in this case only provided if a minimum duration is exceeded.

If the evaluation intensity values 52a,b are within the permissive intensity range Ie, the evaluation intensity values 52a,b are provided to the pulse selection unit 40 and are there evaluated. If one of the evaluation intensity values 52a,b is outside of an optimum intensity range Iopt which is defined by a lower intensity threshold value Iu and an upper intensity threshold value Io, the corresponding pulse selection index 42a,b is changed by the pulse selection unit 40. If the evaluation intensity value 52a,b is below Iu, the corresponding pulse selection index 42a,b is increased to select a signal pulse 36a-c, 37a-c with a higher pulse intensity. If the evaluation intensity value 52a,b is above Io, the corresponding pulse selection index 42a,b is reduced in order to select a signal pulse 36a-c, 37a-c with a lower pulse intensity. If no obstacle 30 interrupts the optical signals 26a,b, the evaluation unit 38 is thus provided with evaluation intensity values 52a,b in the optimum intensity range Iopt.

The safety device of the present invention is thus suited to automatically adapt to a changed intensity of the received signal. Changes in the signal intensity that occur during operation can thereby be compensated and the safety device of the present invention allows for an orderly monitoring of rolling gates of different widths without a manual adaptation of the safety device being required therefor.

The present invention is not limited to embodiments described herein; reference should be had to the appended claims.

LIST OF REFERENCE NUMERALS 10 safety device
12 rolling gate
14 detection device
16 control device
18 gate segments
20 guide rail
22 closing edge
24a,b transmitter units
26a,b optical signals
28a,b receiver units
30 obstacle
32a,b signal path
34a,b signal sequences
36a-c signal pulses
37a-c signal pulses
38 evaluation unit
40 pulse selection unit
42a,b pulse selection indices
43 microcontroller
44a,b electric analog signals
46a,b analog-to-digital converter
48a,b digital signals
49a-c intensity values
50a-c intensity values
51a,b electromagnetic shieldings
52a,b evaluation intensity values
54 trigger signal
56 motor electronics
M drive motor

What is claimed is:

1. An optoelectronic safety device for monitoring a machine movement, the optoelectronic safety device comprising:
   a detection device comprising,
      at least one transmitter unit which is configured to transmit an optical signal which comprises a sequence of signal pulses, each of the signal pulses having a pulse intensity which is different, and
      at least one receiver unit which is configured to receive the optical signal; and
   a control device comprising,
      an evaluation unit which is configured to evaluate the optical signal received by the at least one receiver unit,
      a pulse selection index, and
      a pulse selection unit which is configured to change the pulse selection index if the pulse intensity of one of the signal pulses is outside of an optimal intensity range,
      the control device being configured to enable the machine movement if an intensity of a received signal is within a permissible intensity range, and to output a trigger pulse to stop the machine movement if the intensity of the received signal is outside of the permissible intensity range.

2. The optoelectronic safety device as recited in claim 1, wherein the pulse intensity within the sequence of the signal pulses continuously increases or continuously decreases from a first signal pulse to a last signal pulse.

3. The optoelectronic safety device as recited in claim 1, wherein the control device, the evaluation unit or the pulse selection unit is integrated into the detection device.

4. The optoelectronic safety device as recited in claim 1, wherein the detection device comprises at least two transmitter units and at least two receiver units.

5. The optoelectronic security device as recited in claim 4, wherein,
   each of the at least two transmitter units is configured to transmit a respective optical signal with a sequence of signal pulses, and
   the sequence of signal pulses of each respective optical signal do not overlap in time.

6. The optoelectronic safety device as recited in claim 4, wherein the control device comprises at least two pulse selection indices.

7. The optoelectronic safety device as recited in claim 1, wherein the control device or the evaluation unit further comprises a time module which is configured to detect a duration of an impermissible signal intensity and to output the trigger pulse to stop the machine movement if a minimum duration is exceeded.

8. The optoelectronic safety device as recited in claim 1, wherein the at least one receiver unit or the evaluation unit is further configured to convert an incoming analog signal into an outgoing digital signal.

9. The optoelectronic safety device as recited in claim 1, further comprising:
a microprocessor,
wherein,
the evaluation unit or the pulse selection unit is integrated into the microprocessor.

10. The optoelectronic safety device as recited in claim 1, wherein the at least one receiver unit comprises an electromagnetic shielding.

11. The optoelectronic safety device as recited in claim 1, wherein the detection device or the control device is configured to be mounted on a gate.

12. A method for monitoring a machine movement, the method comprising:
transmitting an optical signal from a transmitter unit, the optical signal comprising a sequence of signal pulses, each of the signal pulses having a pulse intensity which is different;
receiving the optical signal at a receiver unit;
determining individual pulse intensities of the optical signal received; and
evaluating, in an evaluation unit, the pulse intensity of one of the signal pulses of the optical signal received as predetermined by a pulse selection index,
wherein,
a trigger pulse to stop the machine movement is outputted to a control device, if the pulse intensity detected is outside of a permissible intensity range,
an evaluation of the pulse intensity is performed in a pulse selection unit if the pulse intensity detected is within a permissible intensity range, and
the pulse selection index is changed if the pulse intensity detected is outside of an optimal intensity range.

13. The method as recited in claim 12, further comprising:
detecting a duration of an impermissible pulse intensity during the evaluation of the pulse intensity of the signal pulse, which is predetermined by the pulse selection index, in the evaluation unit, and
outputting the trigger pulse to stop the machine movement to the control device if a predetermined minimum duration is exceeded.

14. The method as recited in claim 12, further comprising:
calculating a minimum intensity value or a maximum intensity value, which limits the permissible intensity range as a fraction of an average value.

15. The method as recited in claim 12, further comprising:
transmitting and receiving a plurality of optical signals,
wherein,
the pulse intensity of the signal pulse predetermined by the pulse selection index is separately evaluated in the evaluation unit for each of the plurality of optical signals.

16. The method as recited in claim 12, further comprising:
reducing the pulse selection index if the pulse intensity detected is above the optimal intensity range; and
increasing the pulse selection index if the pulse intensity detected is below the optimal intensity range.

\* \* \* \* \*